(12) United States Patent
Royle et al.

(10) Patent No.: US 7,769,297 B2
(45) Date of Patent: Aug. 3, 2010

(54) DRIVING MULTIPLE TRANSCEIVER MODULES WITH A SINGLE SERDES TRANSCEIVER CHIP

(75) Inventors: David J. Royle, Rockville, MD (US); Walter Hargis, Gaithersburg, MD (US); Mikhail Charny, Derwood, MD (US)

(73) Assignee: Acterna LLC, Germantown, MD (US)

( * ) Notice: Subject to any disclaimer, the term of this patent is extended or adjusted under 35 U.S.C. 154(b) by 524 days.

(21) Appl. No.: 11/846,823

(22) Filed: Aug. 29, 2007

(65) Prior Publication Data

US 2008/0063395 A1    Mar. 13, 2008

Related U.S. Application Data

(60) Provisional application No. 60/824,917, filed on Sep. 8, 2006.

(51) Int. Cl.
*H04B 10/00* (2006.01)
(52) U.S. Cl. ......................... 398/138; 398/136; 398/164
(58) Field of Classification Search ......... 398/135–138, 398/164
See application file for complete search history.

(56) References Cited

U.S. PATENT DOCUMENTS

| | | | |
|---|---|---|---|
| 7,664,401 B2 * | 2/2010 | Nelson et al. | 398/138 |
| 2002/0092972 A1 * | 7/2002 | Ames et al. | 250/214 A |
| 2002/0181895 A1 * | 12/2002 | Gilliland et al. | 385/88 |

* cited by examiner

*Primary Examiner*—Dalzid Singh
(74) *Attorney, Agent, or Firm*—Matthew A. Pequignot; Pequignot + Myers LLC

(57) ABSTRACT

The invention relates to a transceiver optical system in which a single serializer/deserializer (SERDES) chip is used to drive a plurality of transceiver modules.

19 Claims, 5 Drawing Sheets

DRIVING MULTIPLE TRANSCEIVER MODULES WITH A SINGLE SERDES TRANSCEIVER CHIP

CROSS-REFERENCE TO RELATED APPLICATIONS

The present invention claims priority from U.S. Patent Application No. 60/824,917 filed Sep. 8, 2006, which is incorporated herein by reference.

TECHNICAL FIELD

The present invention relates to an optical transceiver system, and in particular to an optical transceiver system in which a single serializer/deserializer (SERDES) is used to drive multiple transceiver modules.

BACKGROUND OF THE INVENTION

In a field service testing instrument, which supports line rates up to and above the 10 Gbps range, e.g. OC192, STM64, 10 GBE, 10GFC, and multiple OTN rates, it is desirable to enable the technician to select from among three common optical wavelengths, i.e. 1550 nm, 1310 nm, and 850 nm, for both transmitting and receiving test signals. Accordingly, conventional testing instruments require three lasers, one for generating signals in each of the aforementioned wavelengths, and two receivers, one for converting 850 nm optical test signals and one for converting both 1550 nm and 1310 nm optical test signals, although only one laser and one receiver are active at a time, i.e. the one the technician has selected. Each laser source and receiver is purchased in the form of a transceiver module, e.g. XFP or SFP module, thus three transceiver modules are required for each testing instrument. Each transceiver module accepts differential, e.g. 10 Gbps, signals to and from a SERDES transceiver device, thus up to three SERDES transceiver devices would normally be required for each testing instrument for transmitting and receiving. The SERDES transceiver device is physically large, consumes considerable power, and is expensive for a field service instrument.

A SERDES or serializer/deserializer is an integrated circuit (IC or chip) transceiver that converts parallel data to serial data and vice-versa. The transmitter section converts an n-bit parallel bus into a differential serial stream, and the receiver section converts a differential serial stream into an n-bit parallel bus. SERDES chips facilitate the transmission of parallel data between two points over serial streams, reducing the number of data paths and thus the number of connecting pins or wires required. Most SERDES devices are capable of full-duplex operation, meaning that data conversion can take place in both directions simultaneously. SERDES chips are used in Gigabit Ethernet systems, wireless network routers, fiber optic communications systems, and storage applications. Specifications and speeds vary depending on the needs of the user and on the application. SERDES devices are capable of operating at speeds in excess of 10 Gbps.

A conventional XFP arrangement is illustrated in FIG. 1, in which an XFP transceiver module 1 is plugged into a host cage assembly 2 mounted on a host circuit board 3. The host cage assembly 2 includes a front bezel 4, a cage receptacle 5, and a host electrical connector 6. The transceiver module 1 is inserted through an opening in the front bezel 4, and through an open front of the cage receptacle 5, until an electrical connector on the transceiver module 1 engages the host electrical connector 6. The cage receptacle 5 has an opening 7 in the upper wall thereof through which a heat sink 8 extends into contact with the transceiver module 1 for dissipating heat therefrom. A clip 9 is provided for securing the heat sink 8 to the cage receptacle 5 and thereby into contact with the transceiver module 1. With this arrangement, the heat sink 8 can be changed to suit the owners individual needs without changing the basic transceiver module 1.

The XFP transceiver module 1 is a hot pluggable, small form factor, serial-to-serial, data agnostic, multi-rate optical transceiver that supports Telecom and Datacom applications. Unlike a 4xXAUI transceiver module, e.g. Xenpak, which have a four-channel interface at 3.125 Gb/s, or other 10 Gb transceiver modules, which have 16-channel interfaces, the XFP transceiver module 1 features a 10 Gb/s 100 ohm differential I/O interface 11 (XFI). One end of the module 1 includes the XFI serial connector 11, which receives and transmits differential signals at 10 Gb/s, while the other end includes input and output optical connectors 12a and 12b, which comply with multiple 10 Gb/s Telecom and Datacom standards. The XFP module's transmitter side includes a clock and data recovery (CDR) section 13, which cleans up and re-times an output electrical signal, and a laser driver 14 and a laser 15, which converts the cleaned up electrical output signal to an optical signal. The receiver side includes a photodetector 16, e.g. PIN or APD receiver, which converts a 10 Gb/s input optical signal to an input electrical signal, and a CDR 17, which cleans up the input electrical signal before sending it to a SERDES 18, which is remote from the XFP module 1 on the host circuit board 3.

An object of the present invention is to overcome the shortcomings of the prior art by providing a system in which a plurality of differential transceiver, e.g. XFP or SFP, modules are driven by a single SERDES transceiver device.

SUMMARY OF THE INVENTION

Accordingly, the present invention relates to an electro-optic system comprising:

a first transmitter, having a differential electrical input including a first transmitter input and a second inverted transmitter input, for transmitting an optical signal at a first wavelength;

a second transmitter, having a differential electrical input including a third transmitter input and a fourth inverted transmitter input, for transmitting an optical signal at a second wavelength different than the first wavelength;

a serializer for converting parallel data from a host device into serial data, having a differential electrical output including a first transmitter output and a second inverted transmitter output, wherein the first transmitter output of the serializer is connected to the first transmitter input, and the second inverted transmitter output of the serializer is connected to the third transmitter input; and inversion means for inverting data passing between the second inverted transmitter output and the third transmitter input.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
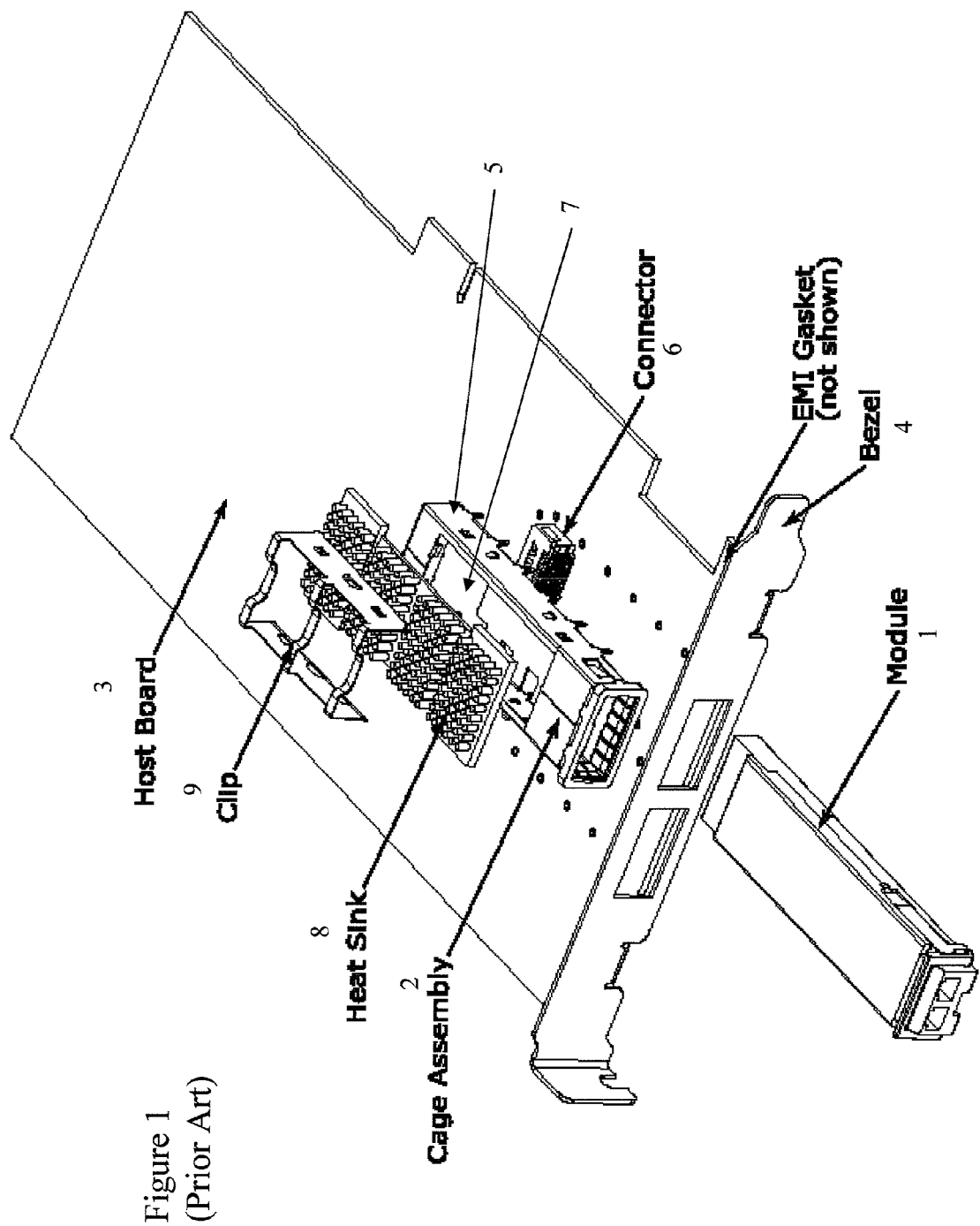
FIG. 1 is an isometric view of a conventional XFP transceiver module in a host cage system.
Figure 2:
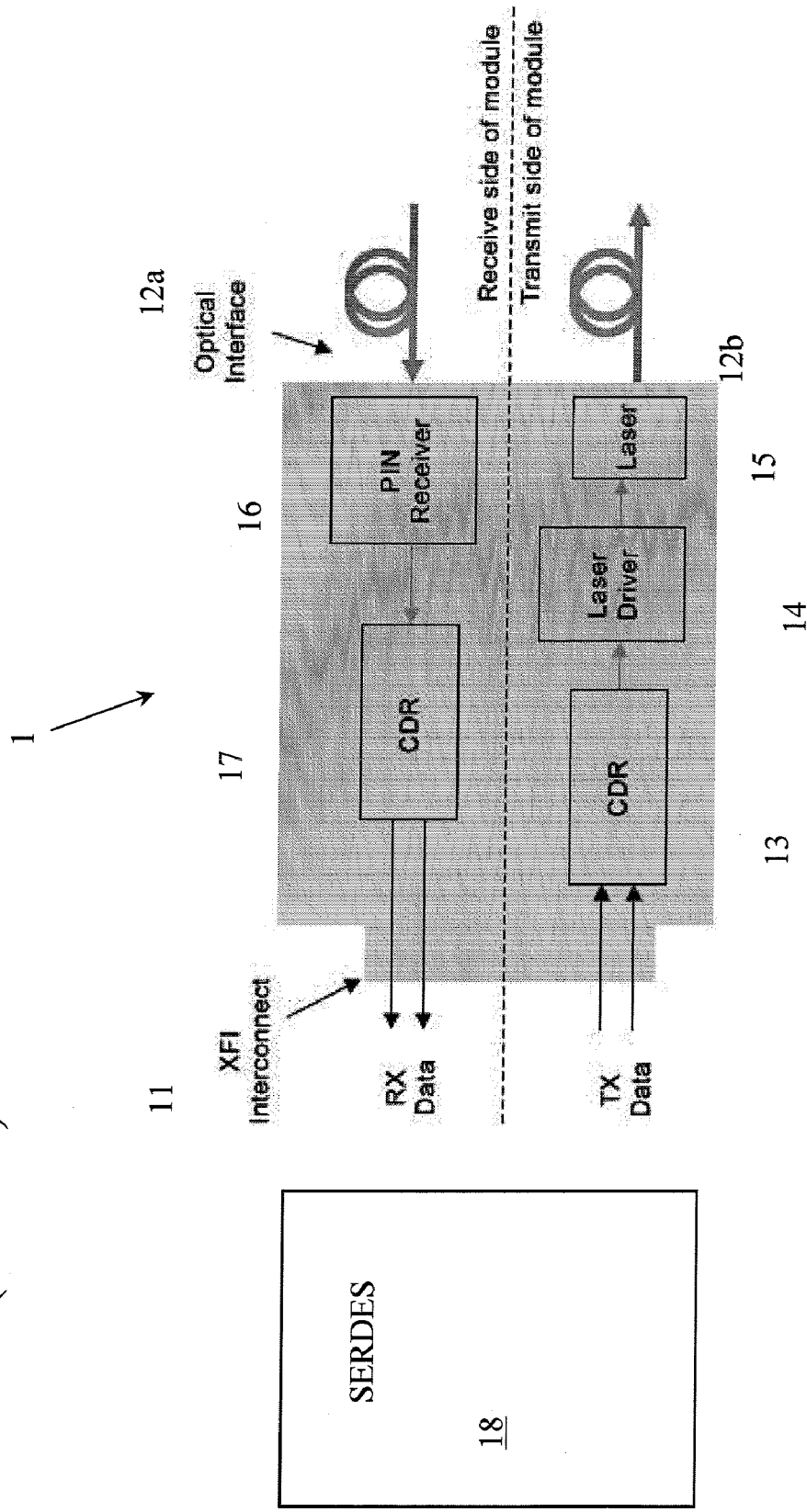
FIG. 2 is a schematic representation of a conventional XFP transceiver module.
Figure 3:
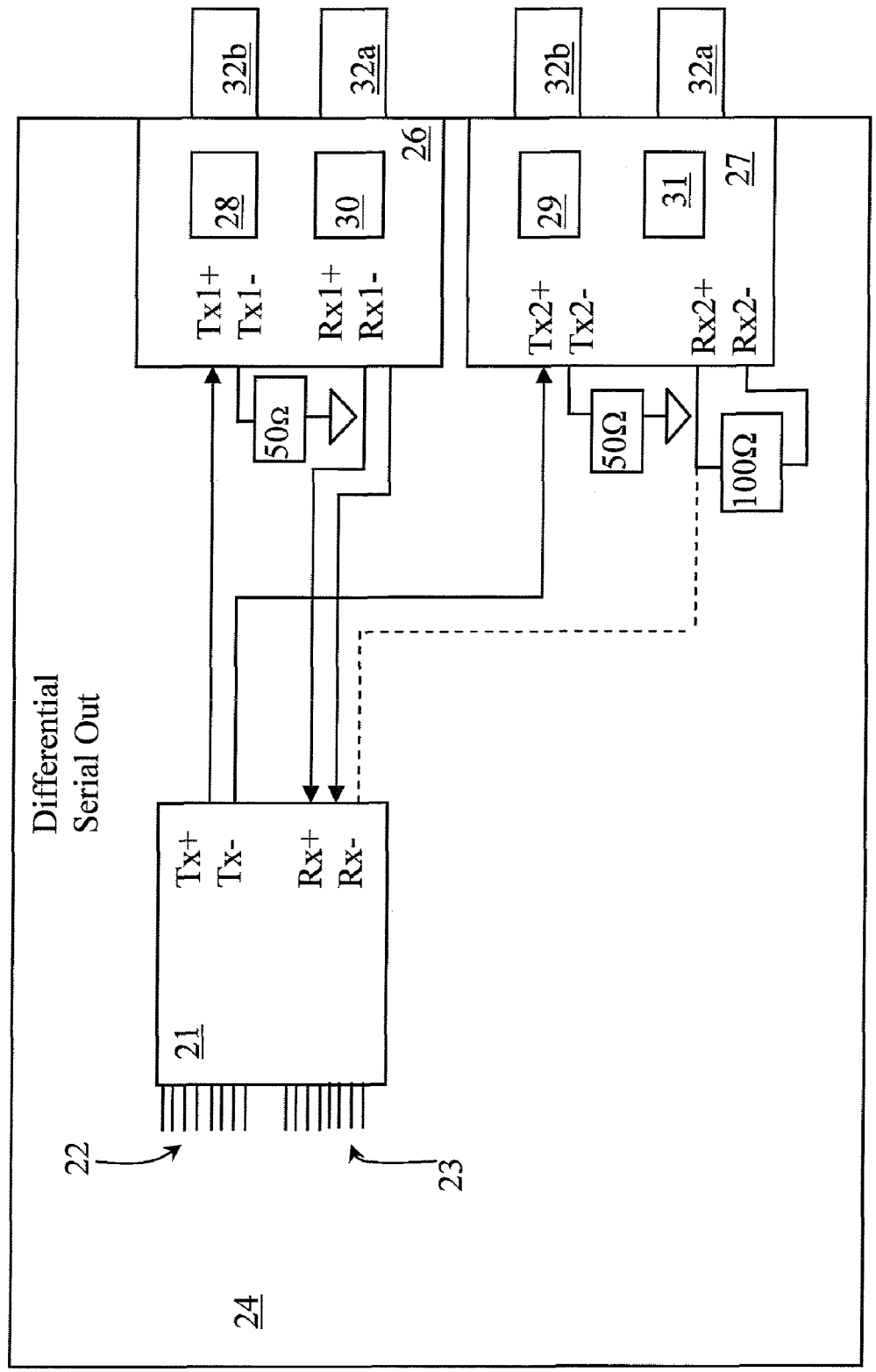
FIG. 3 is a schematic representation of a transceiver system with two transceiver modules and one SERDES device, in accordance with the present invention.

With reference to FIG. 3, a SERDES transceiver chip 21 includes a parallel electrical input connection 22 and a parallel electrical output connection 23 from a printed circuit board 24 of a host device. The serial output of the SERDES transceiver chip 21 is differential and thus includes a normal output Tx+ and an inverted output Tx−, A first transceiver module 26, e.g. an XFP or SFP, has a differential input and thus includes a normal input Tx1+ and an inverted input Tx1−.

The normal output Tx+ of the SERDES chip 21 is connected to the normal input Tx1+ of the first transceiver module 26, while the inverted input Tx1− of the first transceiver module 26 is terminated by a fixed resistance, e.g. a 50Ω resistor. The inverted output Tx− of the SERDES transceiver chip 21 is connected to a normal input Tx2+ of a second transceiver module 27, e.g. an XFP or an SFP, while an inverted input Tx2−, of the second transceiver module 27 is terminated by a fixed resistance, e.g. a 50Ω resistor. When the second transceiver module 27 is in use the data transmitted from the inverted output Tx− of the SERDES transceiver chip 21 to the normal input Tx2+ of the second transceiver module 27 is inverted digitally within the SERDES transceiver chip 21, e.g. changing the state of the SERDES control line, to compensate for the inversion which results from the connection. The remaining elements of the first and second transceiver modules 26 and 27 are identical or similar to those of the transceiver module 1 above, including input and output optical connectors 32a and 32b, respectively.

The transmitter transmission lines, which extend from the normal and inverted outputs Tx+ and Tx− of the SERDES transceiver chip 21 to the normal inputs Tx1+ and Tx2+ of the first and second transceiver modules 26 and 27, respectively, are run in a single ended mode. The receiver transmission lines, which extend to the normal and inverted inputs, Rx+ and Rx−, of the SERDES transceiver chip 21 from the normal and inverted outputs Rx1+ and Rx1− of the first transceiver module 26 are run in a differential mode. The normal and inverted outputs Rx2+ and Rx2−, of the second transceiver 27 are terminated by a fixed resistance, e.g. a 100Ω resistor. Accordingly, a single SERDES chip 21 controls the first transceiver module 26, which includes a transmitter 28 for transmitting a signal at a first wavelength, e.g. 1550 nm, and the second transceiver module 27, which includes a transmitter 29 for transmitting a signal at a second wavelength, e.g. 1310 nm. The first transceiver 26 includes a first receiver 30 for receiving all incoming signals, whereby the first transceiver module 27 can have a higher sensitivity, i.e. a higher quality receiver 30, than the second transceiver 27. Since the second receiver 31 in the second transceiver 27 isn't used, the quality thereof can be much lower than that of the first receiver 30.

Alternatively, the inverted input Rx− can be electrically connected to the normal output Rx2+ of the second transceiver module 27 (as shown in dotted outline in FIG. 3), whereby either of the first or second receivers 30 and 31 can be used. If Rx2+ of the second transceiver 27 is used, the signal is inverted digitally within the SERDES transceiver chip 21 to compensate for the inversion resulting from the connection.

Figure 4:
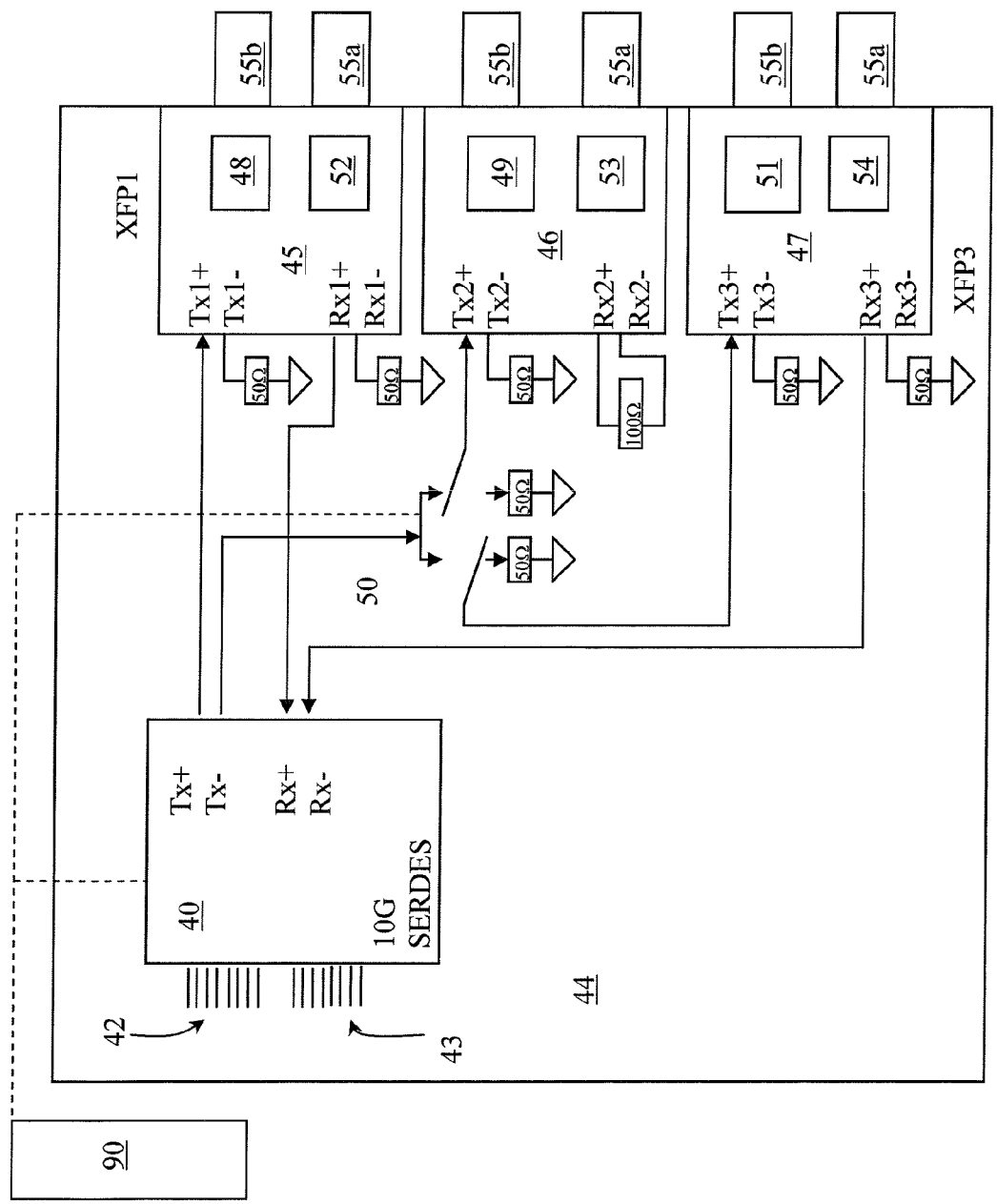
FIGS. 4 and 5 are schematic representations of transceiver systems with three transceiver modules and one SERDES device, in accordance with the present invention.

With reference to FIG. 4, a single SERDES chip 40 includes a parallel electrical input connection 42 and a parallel electrical output connection 43 from a printed circuit board 44 of a host device. In the illustrated embodiment, the SERDES chip 40 drives three transceivers, e.g. XFP or SFP, modules, i.e. first, second and third transceiver modules 45, 46 and 47, respectively. The serial output and input of the SERDES transceiver chip 40 are differential and thus includes a normal output Tx+ and an inverted output Tx−, as well as a normal input Rx+ and an inverted input Rx−. Each of the first, second and third transceiver modules 45, 46 and 47, respectively, also has a differential output and input, and thus includes a normal input Tx1+, Tx2+, Tx3+, respectively, and an inverted input Tx1−, Tx2−, Tx3−, respectively, as well as a normal output Rx1+, Rx2+, Rx3+, respectively, and an inverted output Rx1−, Rx2−, Rx3−, respectively.

The normal output Tx+ of the SERDES transceiver chip 40 is connected to the normal input Tx1+ of the first transceiver module 45, while the inverted input Tx1− of the first transceiver module 45 is terminated by a fixed resistance, e.g. a 50Ω resistor. The inverted output Tx− of the SERDES transceiver chip 40 is connected to a Common pin of a single pole double throw (SPDT) analog switch 50. A first RF pin of the SPDT analog switch 50 is connected to the normal input Tx2+ of the second transceiver module 46, while the inverted input Tx2− of the second transceiver module 46 is terminated by a fixed resistance, e.g. a 50Ω resistor. A second RF pin of the SPDT analog switch 50 is connected to the normal input Tx3+ of the third transceiver module 47, while the inverted input Tx3− of the third transceiver module 47 is terminated by a fixed resistance, e.g. a 50Ω resistor.

All of the devices including a PCB have a fifty ohm characteristic impedance in single ended mode. In differential mode the characteristic impedance is 50×2=100 Ohms. To prevent signal reflections every single ended mode high speed line should be terminated with something having impedance of 50 ohms. If a functional device is not present, a 50 Ohm resistor (or 100 Ohms in differential mode) is connected instead.

When the transmitter in the first transceiver module 45 is in use the switch 50 is set to the second RF pin, connected to Tx3+ of the third transceiver module 47. The cage of the third transceiver module 47 is populated with the third transceiver module 47 or with a simple termination device to terminate the inverted output Tx− of the SERDES transceiver chip 40.

When the transmitter in the second transceiver module 46 or the third transceiver module 47 is in use the outgoing data is inverted digitally within the SERDES transceiver chip 40 to compensate for the inversion, which results from the connection to the inverted output Tx−. Accordingly, any one of the transmitters from the first, second or third transceiver modules 45, 46 and 47, each with different wavelengths, e.g. 1550 nm, 1310 nm and 850 nm, can be selected to transmit a signal, enabling the technician to select any one of the different wavelengths for transmission.

The normal receiver input Rx+ of the SERDES transceiver chip 40 is connected to the normal output Rx1+ of the first transceiver module 45, while the inverted output Rx1− of the first transceiver module 45 is terminated by a fixed resistance, e.g. a 50Ω resistor. The inverted input Rx− of the SERDES transceiver chip 40 is connected to the normal output Rx3+ of the third transceiver module 47, while the inverted output Rx3− of the third transceiver module 47 is terminated by a 50Ω resistor. The normal and inverted outputs Rx2+ and Rx2− of the second transceiver 46 are terminated by a fixed resistance, e.g. a 100Ω resistor. When a first receiver 52 of the first transceiver module 45 is selected to receive an incoming optical signal, a third receiver 54 of the third transceiver module 47 is disabled, but continues to provide a 50Ω termination to the inverted input Rx− of the SERDES chip 40. When the third receiver 54 of the third transceiver module 47 is selected to receive an incoming optical signals, the first receiver 52 is disabled, but continues to provide a 50 Ohm termination to the normal input Rx+ of the SERDES chip 40. When Rx3+ of the third transceiver 47 is used the signal is inverted digitally within the SERDES transceiver chip 40 to compensate for the inversion resulting from the connection. Accordingly, either of the first and third receivers 52 and 54 can be utilized to receive input optical signals. According to the above arrangement, the first receiver 52 can have a different bandwidth or sensitivity than the third receiver 54 for performing different functions, as required by the application, e.g. in a testing device.

The remaining elements of the first, second and third transceiver modules 45, 46 and 47 are identical or similar to those of the transceiver module 1 above, including input and output optical connectors 55a and 55b, respectively.

Figure 5:
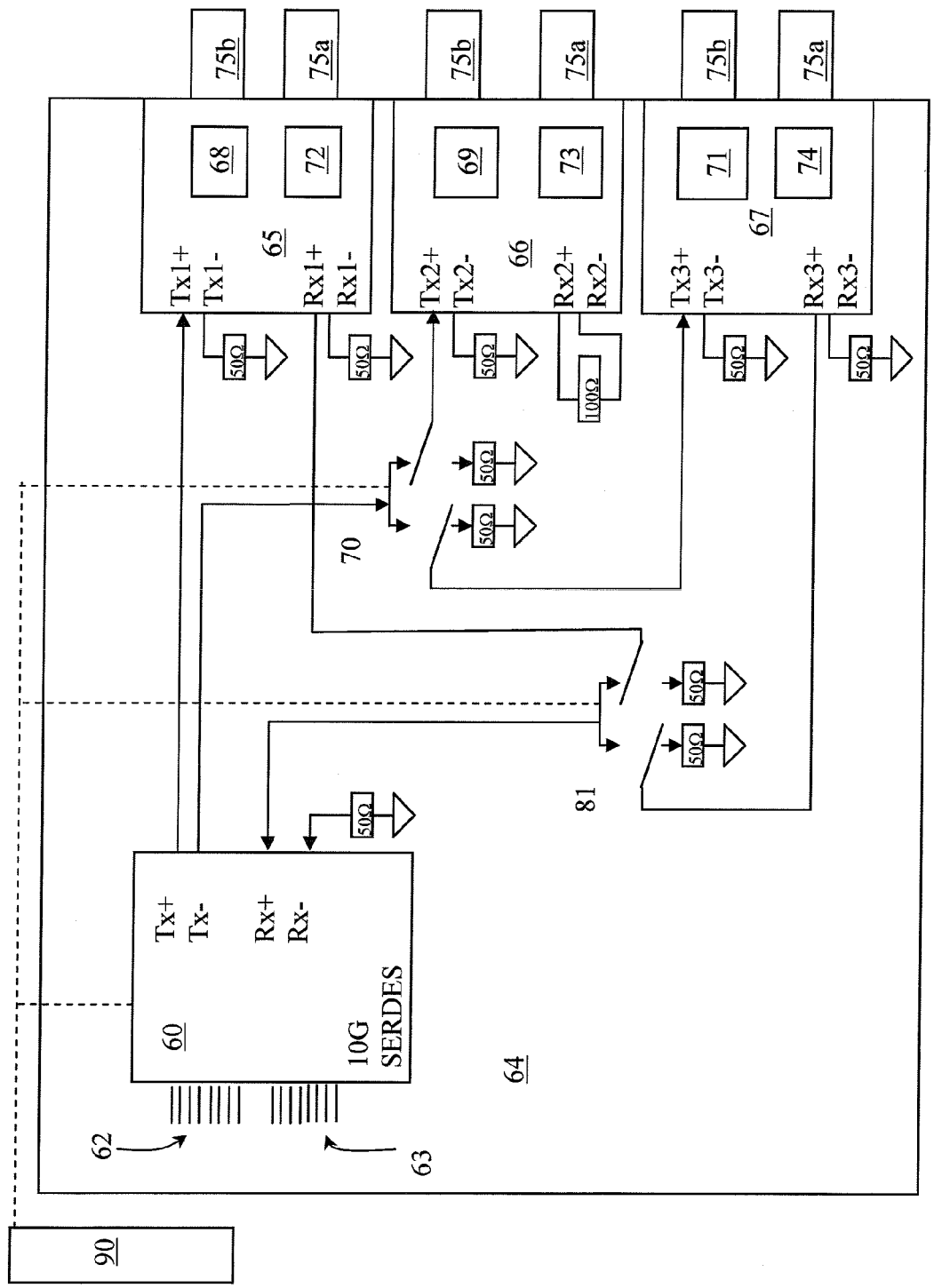

With reference to FIG. 5, a single SERDES chip 60 includes a parallel electrical input connection 62 and a parallel electrical output connection 63 from a printed circuit board 64 of a host device. In the illustrated embodiment, the SERDES chip 60 drives first, second and third transceiver, e.g. XFP or SFP, modules 65, 66 and 67, respectively. The serial output and input of the SERDES transceiver chip 60 are differential and thus include a normal output Tx+ and an inverted output Tx−, as well as a normal input Rx+ and an inverted input Rx−. Each of the first, second and third transceiver modules 65, 66 and 67, respectively, also has a differential output and input, and thus includes a normal input Tx1+, Tx2+, Tx3+, respectively, and an inverted input Tx1−, Tx2−, Tx3−, respectively, as well as a normal output Rx1+, Rx2+, Rx3+, respectively, and an inverted output Rx1−, Rx2−, Rx3−, respectively.

The normal output Tx+ of the SERDES transceiver chip 60 is connected to the normal input Tx1+ of the first transceiver module 65, while the inverted input Tx1− of the first transceiver module 65 is terminated by a fixed resistance, e.g. a 50Ω resistor. The inverted output Tx− of the SERDES transceiver chip 60 is connected to a Common pin of a first single pole double throw (SPDT) analog switch 70. A first RF pin of the first SPDT analog switch 70 is connected to the normal input Tx2+ of the second transceiver module 66, while the inverted input Tx2−, of the second transceiver module 66 is terminated by a fixed resistance, e.g. a 50Ω resistor. A second RF pin of the first SPDT analog switch 70 is connected to the normal input Tx3+ of the third transceiver module 67, while the inverted input Tx3− of the third transceiver module 67 is terminated by a fixed resistance, e.g. a 50Ω resistor.

The remaining elements of the first, second and third transceiver modules 65, 66 and 67 are identical or similar to those of the transceiver module 1 above, including input and output optical connectors 75a and 75b, respectively.

When a transmitter 68 in the first transceiver module 65 is in use the first switch 70 is set to the second RF output pin, connected to normal input Tx3+ of the third transceiver module 67. The cage of the third transceiver module 67 is populated with the third transceiver module 67 or with a simple termination device to terminate the inverted output Tx− of the SERDES transceiver chip 60.

When a transmitter 69 in the second transceiver module 66 or a transmitter 71 in the third transceiver module 67 is in use the data is inverted digitally within the SERDES transceiver chip 60 to compensate for the inversion which results from the connection to the inverted output Tx−. Accordingly, any one of the transmitters from the first, second or third transceiver modules 65, 66 and 67, each with different wavelengths, e.g. 1550 nm, 1310 nm and 850 nm, can be selected to transmit a signal.

The normal receiver input Rx+ of the SERDES transceiver chip 60 is connected to a Common pin of a second single pole double throw (SPDT) analog switch 81, while the inverted input Rx− of the SERDES transceiver chip 60 is terminated by a fixed resistance, e.g. a 50Ω resistor. A first RF pin of the second SPDT analog switch 81 is connected to the normal output Rx1+ of the first transceiver module 65, while the inverted output Rx1− of the first transceiver module 65 is terminated by a fixed resistance, e.g. a 50Ω resistor. A second RF pin of the second SPDT analog switch 81 is connected to the normal output Rx3+ of the third transceiver module 67, while the inverted output Rx3− of the third transceiver module 67 is terminated by a fixed resistance, e.g. a 50Ω resistor.

Accordingly, either of the first and third receivers 72 and 74 can be utilized to receive input optical signals without the need to digitally invert signals for the inverted input Rx− of the SERDES chip 60. According to the above arrangement, the first receiver 72 can have a different bandwidth or sensitivity than the third receiver 74 for performing different functions, as required by the application, e.g. in a testing device.

In a testing device, a touch screen or other user interface device is provided to select via central control 90, which transmitter and receiver are used by activating one of the transmitter and receiver outputs and inputs, respectively, of the SERDES chip, e.g. 21, 40 or 60 and by actuating an appropriate switch, e.g. 50, 70 or 81, all electrically connected and under control of the central control 90.

We claim:

1. An electro-optic system comprising:
   a first transmitter, having a differential electrical input including a first transmitter input and a second inverted transmitter input, for transmitting an optical signal at a first wavelength;
   a second transmitter, having a differential electrical input including a third transmitter input and
   a fourth inverted transmitter input, for transmitting an optical signal at a second wavelength different than the first wavelength;
   a serializer for converting parallel data from a host device into serial data, having a differential electrical output including a first transmitter output and a second inverted transmitter output, wherein the first transmitter output of the serializer is connected to the first transmitter input, and the second inverted transmitter output of the serializer is connected to the third transmitter input; and
   first inversion means for inverting data passing between the second inverted transmitter output and the third transmitter input.

2. The system according to claim 1, further comprising:
   a first receiver, including a first receiver output, and a second inverted receiver output, for receiving an optical signal, and for converting the optical signal into a differential serial input signal; and
   a deserializer connected to the first receiver for converting the differential serial input signal into a parallel signal.

3. The system according to claim 2, wherein the serializer and the deserializer comprise the same serializer/deserializer (SERDES) integrated circuit (IC) chip.

4. The system according to claim 3, wherein the first inversion means is provided in the SERDES IC chip for digitally inverting the data.

5. The system according to claim 2, wherein the first transmitter and the first receiver comprise a first electro-optical module; wherein the deserializer includes a first receiver input and a second inverted receiver input; and wherein the first receiver input is electrically connected to the first receiver output.

6. The system according to claim 5, wherein the second and fourth inverted transmitter inputs are electrically grounded via a fixed resistance.

7. The system according to claim 5, wherein the first electro-optical module is a first XFP or SFP transceiver module.

8. The system according to claim 5, further comprising:
a second receiver including a third receiver output, and a fourth inverted receiver output, wherein the second inverted receiver input is electrically connected to the third receiver output; and
second inversion means for inverting data passing between the second inverted receiver input and the third receiver output.

9. The system according to claim 8, wherein the second transmitter and the second receiver comprise a second electro-optical module.

10. The system according to claim 9, wherein the second electro-optical module is a second XFP or SFP transceiver module.

11. The system according to claim 9, further comprising:
a third electro-optical module including: a third transmitter with a fifth transmitter input and a sixth inverted transmitter input; and a third receiver with a fifth receiver output and a sixth inverted receiver output; and
a switch for selectively electrically connecting the third and fifth transmitter inputs to the second inverted transmitter output.

12. The system according to claim 5, further comprising:
a second receiver including a third receiver output, and a fourth inverted receiver output; and
a first switch for alternatively electrically connecting the first and third receiver outputs to the first receiver input.

13. The system according to claim 12, wherein the second transmitter and the second receiver comprise a second electro-optical module.

14. The system according to claim 13, further comprising:
a third electro-optical module including: a third transmitter with a fifth transmitter input and a sixth inverted transmitter input; and a third receiver with a fifth receiver output and a sixth inverted receiver output; and
a second switch for selectively electrically connecting the third and fifth transmitter inputs to the second inverted transmitter output.

15. The system according to clam 1, further comprising:
a third transmitter, having a differential electrical input including a fifth transmitter input and a sixth inverted transmitter input, for transmitting an optical signal at a third wavelength different than the first wavelength; and
a switch for selectively electrically connecting the third and fifth transmitter inputs to the second inverted transmitter output.

16. An optical network test system comprising:
a first electro-optical module including a first transmitter, having a differential electrical input with a first transmitter input and a second inverted transmitter input, for transmitting an optical signal at a first wavelength, and a first receiver, including a first receiver output, and a second inverted receiver output, for receiving an optical signal, and for converting the optical signal into a differential serial input signal;
a second electro-optical module including a second transmitter, having a differential electrical input with a third transmitter input and a fourth inverted transmitter input, for transmitting an optical signal at a second wavelength different than the first wavelength, and a second receiver, including a third receiver output, and a fourth inverted receiver output, for receiving an optical signal, and for converting the optical signal into a differential serial input signal;
a serializer/deserializer (SERDES) for converting parallel data from a host device into serial data, and for converting the differential serial input signal into a parallel signal, the SERDES including a differential electrical output including a first transmitter output and a second inverted transmitter output, and a differential electrical input including a first receiver input and a second inverted receiver input, wherein the first transmitter output is connected to the first transmitter input, the second inverted transmitter output is connected to the third transmitter input, and the first receiver input is connected to the first receiver output;
first inversion means for inverting data passing between the second inverted transmitter output and the third transmitter input; and
control means enabling the first or the second transmitter to be selected for transmission of an optical test signal.

17. The optical network test system according to claim 16, wherein the second inverted receiver input is connected to the third receiver input;
wherein the optical network test system further comprises second inversion means for inverting data passing between second inverted receiver input and the third receiver input; and
wherein the control means also enables the first and second receivers to be selected for reception of an optical test signal.

18. The optical network test system according to claim 17, further comprising:
a third electro-optical module including a third transmitter, having a differential electrical input with a fifth transmitter input and a sixth inverted transmitter input, for transmitting an optical signal at a third wavelength different than the first and second wavelengths, and a third receiver, including a fifth receiver output, and a sixth inverted receiver output, for receiving an optical signal, and for converting the optical signal into a differential serial input signal; and
a switch for selectively electrically connecting the third and fifth transmitter inputs to the second inverted transmitter output;
wherein the control means also enables the third transmitter to be selected to transmit an optical test signal.

19. The optical network test system according to claim 16, further comprising:
a third electro-optical module including a third transmitter, having a differential electrical input with a fifth transmitter input and a sixth inverted transmitter input, for transmitting an optical signal at a third wavelength different than the first and second wavelengths, and a third receiver, including a fifth receiver output, and a sixth inverted receiver output, for receiving an optical signal, and for converting the optical signal into a differential serial input signal; and a first switch for selectively electrically connecting the third and fifth transmitter inputs to the second inverted transmitter output; and a second switch for selectively electrically connecting the first and fifth receiver outputs to the first receiver input;

wherein the control means also enables the third transmitter to be selected for transmission of an optical test signal, and the second receiver to be selected for reception of an optical test signal.

\* \* \* \* \*